(12) United States Patent
Karandikar et al.

(10) Patent No.: US 7,244,034 B1
(45) Date of Patent: Jul. 17, 2007

(54) LOW CTE METAL-CERAMIC COMPOSITE ARTICLES, AND METHODS FOR MAKING SAME

(75) Inventors: Prashant G. Karandikar, Avondale, PA (US); Jai R. Singh, Trumbull, CT (US); Clarence A. Andersson, Wallingford, PA (US)

(73) Assignee: M Cubed Technologies, Inc., Monroe, CT (US)

( * ) Notice: Subject to any disclaimer, the term of this patent is extended or adjusted under 35 U.S.C. 154(b) by 0 days.

(21) Appl. No.: 10/663,359

(22) Filed: Sep. 16, 2003

Related U.S. Application Data

(63) Continuation-in-part of application No. 10/073,818, filed on Feb. 11, 2002, now Pat. No. 7,169,465, which is a continuation-in-part of application No. 09/378,367, filed on Aug. 20, 1999, now Pat. No. 6,355,340.

(51) Int. Cl.
*G02B 5/08* (2006.01)
*D02G 3/00* (2006.01)

(52) U.S. Cl. .................................. 359/838; 428/912.2

(58) Field of Classification Search ............ 427/419.7, 427/304, 228, 305; 359/838; 428/912.2
See application file for complete search history.

(56) References Cited

U.S. PATENT DOCUMENTS

| | | |
|---|---|---|
| 3,622,283 A | 11/1971 | Sara |
| 3,766,000 A | 10/1973 | Gibson et al. |
| 3,807,996 A | 4/1974 | Sara |
| 3,994,867 A | 11/1976 | Baughman et al. |
| 4,005,183 A | 1/1977 | Singer |
| 4,083,719 A | 4/1978 | Arakawa et al. |
| 4,157,409 A | 6/1979 | Levitt et al. |
| 4,376,803 A | 3/1983 | Katzman |
| 4,444,467 A | 4/1984 | Shuskus et al. |
| 4,451,118 A | 5/1984 | Stalcup et al. |
| 4,535,035 A | 8/1985 | Smialek et al. |
| 4,791,076 A | 12/1988 | Leggett et al. |
| 4,804,586 A | 2/1989 | Tanaka et al. |
| 4,944,904 A | 7/1990 | Singh et al. |
| 5,015,540 A | 5/1991 | Borom |
| 5,110,422 A * | 5/1992 | Alperine et al. ............ 205/159 |
| 5,330,807 A | 7/1994 | Williams |
| 5,505,805 A * | 4/1996 | Papenburg et al. ......... 156/155 |
| 5,523,841 A | 6/1996 | Nara et al. |

(Continued)

OTHER PUBLICATIONS

"BP Amoco Chemicals—Carbon Fibers", selected pages (9) from website www.bpamococarbonfibers.com, Copyright 2000 BP Amoco plc.

(Continued)

*Primary Examiner*—N. Edwards
(74) *Attorney, Agent, or Firm*—Law Offices of Jeffrey R. Ramberg

(57) ABSTRACT

A mirror having low density, low CTE, high thermal conductivity, high elastic modulus, and a reflective, polishable surface. The instant mirror features a silicon-based metal coating as the reflective surface, and a composite body as a support or substrate for the reflecting surface. The composite body features carbon fibers reinforcing a matrix containing silicon metal and optionally some silicon carbide. The metal coating can be elemental silicon metal, possibly in amorphous form, and can be applied by a vapor deposition process such as chemical vapor deposition (e.g., plasma enhanced CVD) or physical vapor deposition such as evaporation or electron beam PVD.

8 Claims, 6 Drawing Sheets

U.S. PATENT DOCUMENTS

| | | | |
|---|---|---|---|
| 5,643,663 A * | 7/1997 | Bommier et al. | 428/317.9 |
| 5,834,115 A | 11/1998 | Weeks, Jr. et al. | |
| 5,993,934 A | 11/1999 | Reese et al. | |
| 6,030,913 A | 2/2000 | Heine et al. | |
| 6,079,525 A | 6/2000 | Dietrich et al. | |
| 6,221,475 B1 | 4/2001 | Domergue et al. | |
| 6,261,981 B1 | 7/2001 | Dietrich et al. | |
| 6,328,834 B1 | 12/2001 | Rebstock et al. | |
| 6,355,340 B1 * | 3/2002 | Singh et al. | 428/312.8 |
| 6,426,968 B1 | 7/2002 | Strife et al. | |
| 6,503,572 B1 * | 1/2003 | Waggoner et al. | 427/431 |
| 6,919,127 B2 * | 7/2005 | Waggoner et al. | 428/325 |

OTHER PUBLICATIONS

Mark A. Ealey, John A. Welllman and Gerald Weaver, "CERAFORM SiC: roadmap to 2 meters and 2Kg/m2 areal density", *Advanced Materials for Optics and Precision Structures*, SPIE Critical Reviews, vol. CR67, pp. 53-70, ISBN 0-8194-2598-2, Sep. 1997.

C.J. Duston and R.L. Wahl, "Precision Cast Silicon Carbide Technology for Large Optics", Report No. AFWAL—TR-87-4104, Nov. 7, 1987, Contract No. F 33615-85-C-5001, pp. i-xiii, 1-7, 113 and 114.

* cited by examiner

LOW CTE METAL-CERAMIC COMPOSITE ARTICLES, AND METHODS FOR MAKING SAME

CROSS-REFERENCE TO RELATED APPLICATIONS

This patent document is a Continuation-in-Part of U.S. patent application Ser. No. 10/073,818, filed on Feb. 11, 2002, now U.S. Pat. No. 7,169,465 which is a Continuation-in-Part of U.S. patent application Ser. No. 09/378,367, filed on Aug. 20, 1999, now U.S. Pat. No. 6,355,340.

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of Contract No. F29601-03-C-0012 awarded by the Air Force Research Laboratory.

BACKGROUND OF THE INVENTION

1. Field of the Invention

The present invention relates to articles made from metal-ceramic composite materials featuring a particular kind of fibrous reinforcement. In particular, the invention relates to metal-ceramic composite mirrors having low thermal expansion coefficient.

2. Discussion of Related Art

Light-weight mirrors and structures are required in many government as well as commercial systems, including space systems. There are some very specific property demands on the materials used for construction of these mirrors and structures. These include lightweight, high stiffness, low to zero coefficient of thermal expansion (CTE), high thermal conductivity, polishability and adequate strength and toughness. Traditionally, low or ultra low expansion glasses and glass ceramics have been used along with metallic coatings for mirror constructions. However, there are several disadvantages of glasses such as low specific stiffness, low toughness, etc. Recently, beryllium, silicon carbide, and carbon fiber/polymer composites have been proposed for this application. However, each of these has its own limitations such as toxicity, non-zero expansion (Be); shape making difficulty, non-zero expansion (SiC); and environmental instability and low thermal conductivity ($C_f$/polymer). The only way to achieve zero-CTE in a composite requires use of negative CTE reinforcement, such as ultra high modulus carbon fibers as a reinforcement.

It has been known for a long time to add fibrous reinforcement to metals to increase mechanical properties such as specific strength and specific stiffness. One of the early such reinforcements was carbon or graphite fiber, produced from polymer precursors. The resulting composite material offered double or triple the strength or stiffness compared to the bulk, unreinforced metal. Processing was difficult, however, as the metals either tended not to wet the carbon fibers, or reacted with the carbon. Considerable energy has been devoted to developing ways to preserve the chemical and physical integrity of the fibers while rendering them more chemically compatible with the metal matrix.

Carbon fibers can be manufactured with high degrees of anisotropy. The graphite form of carbon in particular features a hexagonal crystallographic structure, with the covalent bonds within the {001} planes being strong, and the bonds between the {001} planes consisting of weak van der Waals bonds. It is possible to preferentially align the crystallographic planes in a graphite fiber such that the {001} planes tend to be parallel to the graphite fiber axis. By increasing the relative amount of covalent bonds in the fiber axis direction, a fiber possessing high strength and high elastic modulus in the direction of the fiber axis is produced. An interesting and unusual phenomenon that accompanies the alignment of the high strength, high modulus direction is that this particular direction also possesses a negative CTE. Thus, instead of expanding upon heating like most materials, these fibers actually shrink in the axial direction. In the radial direction of such fibers, however, the strength and elastic moduli are relatively low and the CTE is positive and relatively high.

When a reinforcement material having a negative CTE is incorporated into a composite material whose matrix component has a positive CTE, the individual CTE's tend to offset or cancel one another, yielding a composite or overall CTE somewhere between the two values. Because of this counterbalancing or offset effect, it is theoretically possible to engineer a metal matrix composite material, such as a metal-ceramic composite material, to have a net overall CTE of zero. By incorporating parallel arrays of such fibers into a positive CTE isotropic matrix, a composite material having a high modulus and a zero or near-zero CTE in the axial direction of the fibers can be produced. In the direction transverse to the fiber axes, the modulus would be relatively low and the CTE would be relatively high. Because of the axial stiffness, the properties of the composites tend to be dominated by the axial properties.

The degree of anisotropy can be reduced by distributing the fiber orientations. One technique for accomplishing this is to arrange the fibers in parallel within a thin sheet or "ply", and to place a number of such plies on top of one another such that fibers in one ply are skew with respect to fibers in an adjacent ply. With suitable arrangements of the plies it is possible to produce quasi-isotropic sheet materials. Quasi-isotropic lay-ups of thin plies of the composite can be achieved by orienting successive plies at 0°, +45°, −45° and 90°; or 0°, +60° and 60° with respect to the fiber axes. The distribution of the fiber directions, however, significantly reduces the CTE influence of the fibers (as will be illustrated later); thus, it becomes that much more difficult to produce composites that have zero or near-zero CTE's in the dominant plane of the composite.

U.S. Pat. No. 3,807,996 to Sara teaches a carbon fiber reinforced nickel matrix composite material. Sara discloses the use of high strength, high modulus carbon fibers, as well as various geometrical arrangements of the fibers, such as arrays (plates) of parallel fibers and cross-plies (laminates) of such arrays.

U.S. Pat. No. 4,083,719 to Arakawa discloses a carbon fiber reinforced copper composite featuring a low thermal expansion coefficient and no directional characteristic of the mechanical properties. The resulting composite bodies featured CTE as low as $4 \times 10^{-6}$ cm/cm per degree K (hereinafter referred to as "parts per million per degree Kelvin" or ppm/K).

U.S. Pat. No. 4,157,409 to Levitt et al. discloses treating carbon fibers with molten NaK to permit wetting by molten aluminum, magnesium, copper, zinc, tin or lead matrix metals.

U.S. Pat. No. 5,834,115 to Weeks, Jr. et al. discloses protecting carbonaceous reinforcement materials such as fibers with molybdenum carbide and then infiltrating with a molten metal to produce a composite body. A woven fabric of coated graphite fibers reinforcing a copper matrix exhibited a CTE between about 4 and 7 ppm/K).

High modulus carbon fibers have also been incorporated into polymeric matrices. U.S. Pat. No. 5,330,807 to Williams discloses a composite laminated tubing intended for offshore oil extraction operations. There the problem was the need to transfer oil in a tube over appreciable distances and in which the tube may undergo considerable temperature excursions due to the elevated temperature of the extracted oil. To minimize the expansion of the tube length and thereby ameliorate the propensity for the tube to fail by buckling, the tubing is made of a plurality of layers of fibers fixed in a plastic matrix. The fibers may be graphite fibers, glass fibers, ceramic fibers or polymer fibers, but in any case the fibers have a sufficiently low CTE as to impart to the tubing an overall CTE of no more than about 1.1 ppm/K, and a Poisson's ratio near 0.5.

In many environments, however, polymer matrix composites cannot be used because of insufficient resistance to extremes of temperature, corrosion or radiation. Accordingly, some workers have used glass as the matrix material. Glass has several attractive properties for these types of materials, including fluidity or flowability, wettability to the fibers and the potential for relatively low CTE's. For a laser mirror application, for example, Stalcup et al. (U.S. Pat. No. 4,451,118) hot pressed a mixture of a low expansion borosilicate glass and alternating plies of high modulus graphite fibers. Some of the graphite fibers were arranged perpendicular to the reflecting surface so as to be better able to conduct heat away from the mirror surface. Still, cooling passages had to be placed into the mirror structure to permit circulation of a heat exchange fluid.

Similarly, in U.S. Pat. No. 4,791,076 Leggett et al. discloses a graphite fiber silica matrix composite composition having a near-zero overall CTE. In addition to silica, the matrix contains boron phosphate and beta-spodumene, and Leggett states that the composite CTE is tailorable between −1 and +1 ppm/K by varying the matrix composition. As a consequence of the low CTE, very little thermal distortion occurred in for example, a laser mirror application, particularly at low coolant flow rates. This glass matrix composite material exhibited much less thermal distortion than did other laser mirror materials such as single crystal molybdenum or silicon. Although the cooling requirements were reduced, active cooling techniques involving heat transfer media flowing through channels in the mirror still were required.

As mentioned above, glass matrix composites have been used in environments where low expansion polymer composites would be insufficiently durable. Many of these applications, however, require high thermal conductivity, and most glasses are deficient in this area. Thus, composites workers have attempted to address the thermal conductivity problem by relying on the carbon fibers to carry this responsibility, the carbon fibers possessing relatively high thermal conductivity in the fiber axis direction. Another problem with glass matrix composites, though, is that they tend to be brittle. In many applications in which such composites are subjected to accelerations and stresses, such as with semiconductor fabrication equipment, it would be preferable to have a tougher, more impact resistant material.

A number of metals such as aluminum and magnesium are intrinsically highly thermally conductive and tough, and possessing low specific gravity and sufficient durability in harsh environments as to make them candidates for aerospace or precision equipment applications. Unfortunately, these metals suffer from having relatively high CTE's—typically around 20 ppm/K or higher. There seem to be no successes or even proposals to make composites using these high modulus carbon fibers as the reinforcement of a light metallic matrix for the express purpose of producing very low CTE metal matrix composites. The lowest CTE achieved for such MMC's appears to be the 4 ppm/K of U.S. Pat. No. 4,083,719, which represents work done years ago. While quite low in comparison to unreinforced metals, there are applications, such as in optical systems that undergo temperature fluctuations, where even lower CTE's would be desirable.

The CTE of the composite body is also influenced by the elastic modulus of the individual composite constituents. More specifically, Equation 1 shows the mathematical relationship among CTE, elastic modulus, and volume fraction.

Equation 1:

$$\alpha_{11} = \frac{V \cdot E_{11f} \cdot \alpha_{1f} + (1-V)E_m \cdot \alpha_m}{V \cdot E_{11f} + (1-V) \cdot E_m}$$

where:
V is the volume fraction of fibers;
$E_m$ is the elastic modulus of the matrix;
$E_{11f}$ is the elastic modulus of the fibers in the axial direction;
$\alpha_{1f}$ is the CTE of the fibers in the axial direction;
$\alpha_m$ is the CTE of the matrix; and
$\alpha_{11}$ is the CTE of the composite body in the fiber axial direction.

Obviously, the larger the contributing CTE's of reinforcement and matrix, the larger the overall CTE of the composite. As Equation 1 also demonstrates, however, the CTE of the composite is related to the elastic moduli of the matrix and reinforcement phases. Moreover, this equation shows that reducing the modulus of the matrix relative to the modulus of the reinforcement reduces the CTE contribution of the matrix to the overall composite CTE, therefore causing the composite CTE to trend toward the CTE of the reinforcement. For reinforcement materials possessing negative CTE such as certain high modulus carbon fibers (at least in the axial direction), the averaging of the matrix and reinforcement CTE's to yield the CTE of the composite tends to produce a CTE "cancellation". Thus, it is at least theoretically possible with a proper balancing of CTE's to engineer the overall CTE of the composite to be zero.

One must bear in mind, though, that the situation described immediately above represents the case in which the fibers are aligned. Such a composite would be highly anisotropic, and the composite CTE would be zero or near-zero only in the direction parallel to the fiber axes. In other directions, the overall CTE of the composite body would be non-zero and positive.

Over the years, there has been a significant amount of work directed to reinforcing SiC composites, e.g., reaction-bonded SiC composites, with carbon fibers. See, for example, U.S. Pat. Nos. 4,118,894; 4,944,904 and 6,248,269. None of these patent documents expressly state low CTE as an objective; however, because the matrices of these composite materials consist of low CTE substances, i.e., SiC, typically interconnected, and typically also some residual, unreacted Si, also typically interconnected, the resulting composite bodies are expected to inherently feature a low CTE, e.g., on the order of about 2.6–2.8 ppm/K for Si/SiC composites. For example, U.S. Pat. No. 6,248,269 to Dietrich et al. discloses a reaction-bonded SiC composite suitable for braking applications, e.g., disk and pad, for motor vehicles, consisting of carbon fibers arranged isotropically and embedded in a matrix of 40–50 volume percent SiC and not more than 15 volume percent Si. The carbon fibers are protected from chemical reaction with the Si infiltrant by infiltrating a pitch resin into the mass of fibers prior to the Si infiltration step.

U.S. Pat. No. 4,944,904 to Singh et al. discloses a similar composite material system intended mostly for high temperature, aerospace applications, such as a turbine engine component, but also mentioning applications such as wear parts and acoustic parts. The matrix comprises at least 5 volume percent SiC but preferably at least 45 percent, and 1–30 volume percent Si but preferably 1–2 percent. The fibers may be carbon or SiC, but are not disclosed as being arranged isotropically or quasi-isotropically. The fibers similarly are protected from attack by the molten silicon, but here, the protective coating consists of boron nitride plus an overcoat of a silicon-wettable material such as carbon or metal carbides such as SiC. The BN also provides a debond layer so that the fibers can move relative to the matrix under mechanical loading, thereby providing a toughening aspect to the resulting composite body. Again, low CTE does not appear to be an express objective of either of these reaction-bonded SiC composite patents; however, the formed composites are expected to inherently possess a low CTE, as most of the constituents are low CTE materials.

Ealey et al. applied RBSC technology to the problem of fabricating a mirror requiring low CTE, high thermal conductivity, high elastic modulus and low density ("CERAFORM SiC: roadmap to 2 meters and 2 Kg/m$^2$ areal density", *Advanced Materials for Optics and Precision Structures*, SPIE Critical Reviews, Vol. CR67, pp. 53–70, ISBN 0-8194-2598-2, September 1997). Normally, it is difficult to obtain a smooth polish of a reaction-bonded SiC surface because the silicon phase tends to be removed at a much faster rate than does the SiC phase; however, Ealey at al. claim to have overcome this problem through careful control of the polishing conditions, particularly of the pH of the polishing slurry. They report a CTE for their CERAFORM SiC of about 2.44 ppm/K. Although such a CTE generally is considered to be low, there are applications that desire still lower CTE, or even zero CTE, if possible. Further, a key requirement of reaction-bonded SiC mirrors is polishability. Even if the SiC and Si phases can be polished at the same rate, they report that the polish rate is only ⅓ to ½ that of glass. Further, they have experimented with polishing amorphous Si coatings applied to CERAFORM SiC by a vapor deposition process.

OBJECTS OF THE INVENTION

It is an object of the invention to produce as a shaped article a mirror of optical quality.

It is an object of the invention to produce as a shaped mirror whose reflecting surface is readily polishable.

It is an object of the present invention to produce a mirror having a low thermal expansion coefficient.

It is an object of the present invention to produce a mirror having a relatively high thermal conductivity.

It is an object of this invention to produce a mirror that can maintain its structural integrity at higher temperatures than can polymeric materials.

It is an object of this invention to produce a mirror that is more resistant to the effects of radiation than are polymers.

It is an object of the invention to produce shaped articles containing or consisting essentially of metal-ceramic composite materials featuring a reinforcement containing carbon fibers.

It is an object of the invention to be able to assemble complex-shaped preforms from a plurality of smaller, simpler-shaped components or "preform subunits".

SUMMARY OF THE INVENTION

These and other objects of the present invention are achieved by producing a mirror blank or substrate from the carbon fiber reinforced metal-ceramic composite material, coating a reflective and polishable material onto the surface that is to be reflecting, and grinding/polishing the coating to the desired finish. In a preferred embodiment, the coating consists essentially of silicon metal, and the matrix component of the metal-ceramic composite material contains SiC and Si. Also preferred is that the composite material is made by an infiltration technique, and in particular by infiltrating molten infiltrant comprising silicon metal into a porous preform of the mirror blank comprising the carbon fibers. A large and/or complex-shaped preform can be assembled by adhesively bonding together two or more smaller and/or simpler-shaped preforms. The adhesive can be a carbonaceous substance that optionally can contain one or more filler materials, such as the kind and/or amount of fillers contained in the individual preforms. Usually, the carbon fibers are coated with a substance to prevent or at least attenuate their chemical corrosion by the molten silicon during infiltration. Also preferred is that the preform contain at least some quantity of carbon-containing material that is chemically reactable with molten silicon, thereby forming at least some SiC in-situ in the formed composite material. Also preferred is that the mirror blank feature one or more ribs or struts bonded to the back face to enhance strength and stiffness disproportionate to their mass.

In an alternate aspect of the invention, low CTE is achieved by reducing the elastic modulus of the matrix relative to that of the low CTE reinforcement, specifically, by introducing voids or pores in the matrix material. One such technique for introducing such porosity is by dissolving hydrogen gas into a melt of the metal that is to be the matrix, and causing the gas to come out of solution as bubbles upon solidification of the metallic matrix. Another is to incorporate one or more filler materials comprising hollow bodies into the composite.

DETAILED DESCRIPTION OF THE INVENTION AND PREFERRED EMBODIMENTS

Figure 1:
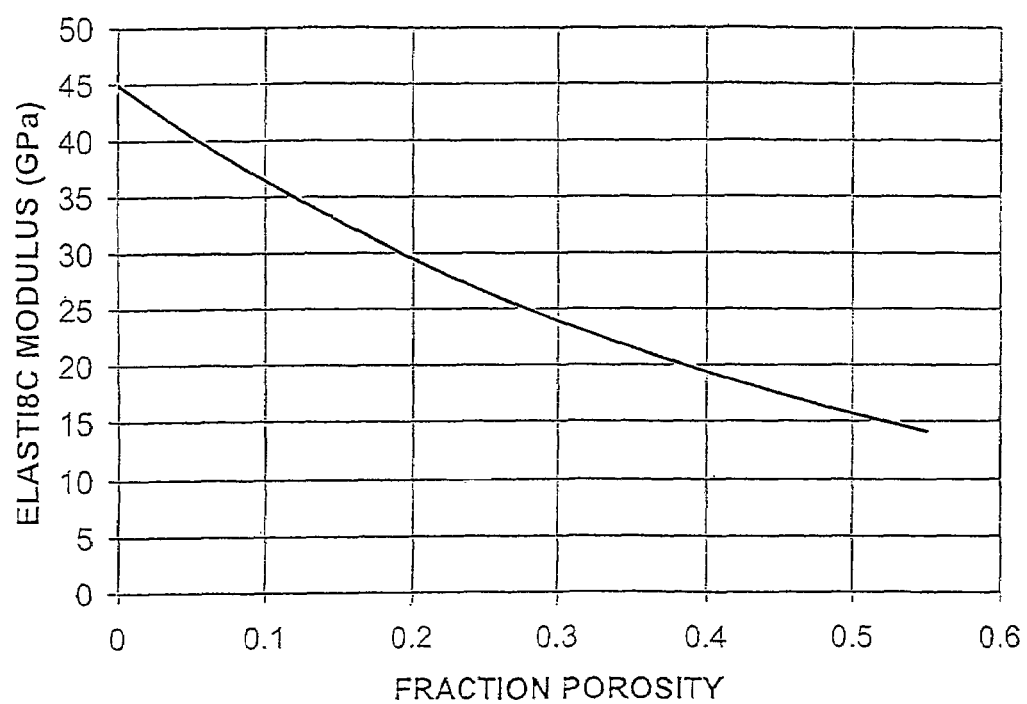
FIG. 1 is a plot of elastic modulus as a function of porosity for magnesium.

Siliconized SiC or reaction-bonded SiC possesses many of the desirable features required of a high precision mirror, particularly one subjected to large accelerations or one that must be deployed in space: low density, low CTE, high stiffness and high thermal conductivity.

The instant invention takes the approach of coating a highly reflective and readily polishable material onto the Si/SiC composite substrate, the silicon coating serving as the reflective surface for the mirror. This approach overcomes some of the polishing problems created by this Si/SiC composite substrate material, namely, the potential non-uniformity of polishing, and slow polishing. Moreover, the instant invention further enhances one or more properties of the Si/SiC composite body to make it even better as a mirror—reducing CTE even further, for example. In particular, the instant invention adds low CTE reinforcement such as carbon fiber to the Si/SiC composite system to reduce overall CTE still further. The instant invention also uses silicon-based metal, e.g., substantially pure silicon, as the reflective surface of the mirror. Monolithic silicon is easy to polish, wears uniformly, and is easy to apply/bond to Si/SiC composite materials, and has a good CTE match to such composite materials as well.

This represents a first aspect of the invention.

Although it is possible to make carbon fiber-reinforced metals and ceramics by techniques such as sintering or hot pressing, etc, the present inventors prefer infiltration techniques. For example, composite bodies made by infiltration typically exhibit much less dimensional change upon infiltration than do composite bodies made by sintering. A particularly preferred infiltrant is silicon metal or alloy. Not only does silicon possess low CTE, important for many of the applications contemplated by the inventors, but, depending on the other processing conditions, one can use this infiltrant system to produce predominantly metal-based composite bodies, or predominantly ceramic-based composite bodies. For example, even in the absence of a reactable carbon source, under the right conditions, molten silicon can spontaneously wick into a porous mass of silicon carbide without the need to draw the molten silicon in under vacuum or to force it in under pressure. See, for example, U.S. Pat. No. 3,951,587 to Alliegro et al. The instant invention refers to this product as "siliconized SiC", and to the process by which it is made as "siliconizing." This infiltration works best in a vacuum atmosphere. When the porous mass contains some free or reactable carbon that is available to react chemically with the molten silicon, the infiltration usually is enhanced and the process is generally more robust. The instant invention refers to this product as "reaction-bonded SiC", and to the process by which it is made as "reaction-bonding", although other terms have been used in the literature over the years to mean substantially the same thing. These terms include "reaction forming", "reaction sintering" and "self bonding". Both the siliconizing and the reaction-bonding processes are within the scope of the instant invention.

One of the issues that arises with attempts to make metal or ceramic composites by infiltration that are reinforced with carbon fibers is that many of the desirable matrix metals, such as silicon and aluminum, react with the fibers. (Strictly speaking, silicon is a semimetal or "metalloid", but in the context of the present invention, silicon will be considered a metal.) Aluminum, for example, reacts with carbon to form aluminum carbide. Not only does this represent a chemical degradation of the graphite reinforcement fibers, but also aluminum carbide is hygroscopic. The chemical conversion of aluminum carbide to aluminum hydrate from exposure to water (such as water vapor) produces acetylene gas plus a large positive volume change that can cause cracking in the composite body.

Therefore, one or more coatings may be placed onto the carbon fibers to protect the fibers from being corroded by these reactive matrix metals. Sometimes, coatings can be found that also permit the infiltrant metal (e.g., aluminum) to wet the reinforcement better. Wetting of the metal to the reinforcement may improve the mechanical properties of the resulting metal composite, and the wetting condition may also permit the metal to infiltrate a porous mass of the reinforcement material without the need to force the molten metal in under pressure, or to pull it in under applied vacuum. For silicon or silicon alloy melts, a desirable additional coating is silicon carbide, and a widely known technique for depositing a coating of silicon carbide onto carbon fibers is by chemical vapor deposition (CVD).

Another technique for protecting the carbon fibers when the infiltrant includes silicon is to coat the fibers with additional carbon prior to infiltration. Carbonaceous materials such as pitch, phenolic resin, furfural alcohol, epoxy resin, etc. are popular choices in this regard, and in fact, some suppliers to carbon fibers and fabrics sell their products in this coated condition, sometimes referred to as "prepregs". The composite system furthermore can be engineered such that not all of the added carbon reacts to form SiC. The residual carbon then can serve to permit some movement in the axial direction of the fibers relative to the matrix, e.g., serve as a fiber debond layer, should such behavior be desirable. A metal-ceramic composite whose matrix is based on silicon typically is brittle, and accordingly, fibrous reinforcement having debond coatings thereon for toughening is generally desirable.

If necessary or desirable, the carbon fibers of the reinforcement phase may be supplemented with one or more other filler materials, which could be other forms of carbon not intended to react with the infiltrant to form silicon carbide, or other non-elemental carbon materials such as metal carbides, or non-carbon-containing materials such as refractory metals, borides, nitrides or oxides, or complex compounds, e.g., oxycarbides. A popular filler material morphology is that of particulate because particulate is so readily available, but other non-limiting morphologies include spheres, platelets and flakes.

Where the carbon fibers are in the form of discontinuous fibers such as an extruded fiber that has been chopped up to make short-length fibers or whiskers, the discontinuous fibers and the other fillers may simply be placed into a common container and mixed together. Alternatively, the discontinuous fibers can be processed according to one or more of the ceramic processing techniques that are known and used in the art to make shaped structures. On the other hand, where the carbon fibers are part of a "continuous"

fiber, such as that which is the direct product of extrusion, it may be desirable to first form the preform shape from a three-dimensional weave of the fibers, or laminated sheets of woven or non-woven fibers, and then introduce the other filler(s) to the developing preform, for example, as a slurry. If the preform is to contain free or reactable carbon, such can also be added at this time, (if it has not already been added), such as by dipping the preform into a carbon-containing paint or slurry.

Preforms are useful because they more exactly define the final desired shape, and thus contribute to reducing the amount of final machining required to produce a carbon fiber reinforced article of some specific shape. A preform usually is thought of as a porous mass containing the filler or reinforcement of the composite body that has been rendered self-supporting, such as with a binder or coating of some kind. Often times, the preform has the shape, or is made to conform to the shape of the final object desired, such as by molding or so-called "green" machining. Additionally, and particularly for complex shaped articles, one may build up the larger, more complex structure from two or more smaller, simpler-shaped preforms, for example by adhesive bonding the component preforms to one another. Carbonaceous adhesives such as phenolic resin, epoxy, cyanate ester, etc. are well suited for this purpose. Further, one can add one or more filler materials, e.g., carbon fibers, to the carbonaceous adhesive, for example, to more closely match one or more physical properties of the adhesive to those of the component preforms.

Again, where composites have been made by others employing the reactive infiltration of silicon into a preform containing carbon to produce silicon carbide, the objective usually has been to maximize the amount of SiC and to minimize the amount of Si, e.g., for refractory applications. Since the present invention involves the infiltration of molten silicon into a porous preform to produce a Si/SiC composite body, the practitioner has wide latitude in the kind of composite body that he or she can process. For instance, she can maximize the amount of SiC produced by providing a preform that is highly loaded in SiC reinforcement and/or producing lots of in-situ SiC from reaction of molten Si with reactable carbon in the preform.

On the other hand, where something more akin to a metal matrix composite has been the objective, the practitioner of the instant invention can produce this by providing a preform that is not highly loaded in ceramic and by minimizing the degree of reaction that the molten Si undergoes with carbon sources as it infiltrates the preform. Prior investigators tended to find reasons to avoid silicon as a matrix metal, favoring other, tougher metals. However, not all applications of MMCs require toughness. Nevertheless, even where some degree of toughness is required, there are techniques for increasing toughness of a silicon matrix composite, e.g., fiber debonding or alloy modifications to the matrix phase.

Accordingly, a composite material that is high in silicon metal has many desirable features, and should not be overlooked or dismissed. For example, at about 2.7 ppm/K, silicon possesses a low coefficient of thermal expansion, and its thermal conductivity is relatively high at about 151 W/mK. Silicon carbide also possesses these properties, but as a candidate matrix material, silicon possesses a number of advantages over silicon carbide. Again, where a composite material is to be reinforced with a reinforcement having a CTE lower than that of the matrix, as is the case for carbon fiber reinforcement, the lower elastic modulus of Si compared to that of SiC serves to shift the composite CTE toward that of the fibers, i.e., to further reduce composite CTE. Further, and not specifically applying only to composites having negative CTE reinforcement, silicon is machinable by electrodischarge machining (EDM), whereas silicon carbide is not. Moreover, some applications such as certain components in a semiconductor lithography machine, are required to be coated, such as by plating, and in this regard, silicon is easier to plate than is silicon carbide, i.e., electroplating requires electrical conductivity. Still further, silicon possesses a slight advantage over silicon carbide in the sense that its CTE is lower, and its toughness is higher.

Many if not most of the applications contemplated by the instant invention are below the ductile/brittle transition temperature of silicon; thus, the silicon component of the composite body is brittle. Accordingly, unlike the situation where the matrix is tough (as it is inherently with most metals, at least in a stress-relieved condition), it may be desirable to provide a toughening mechanism to the instant silicon-containing composites. One way is the technique commonly employed in CMC's—namely to cause the fibers to debond from the matrix under applied load, or at least to be able to move axially with respect to the matrix under the influence of an applied load. This technique is commonly achieved with a debond layer such as carbon (e.g., pyrolytic carbon) or boron nitride applied to the fibers. However, with Si/SiC composite systems, such coatings are often reactive with the molten Si infiltrant, typically resulting in the loss of the debonding property. On the other hand, such coatings, such as boron nitride in particular, may not be wetted by molten Si, thus preventing infiltration. However, since it was stated earlier that the carbon fiber reinforcement itself is reactive with many of the candidate matrix metals and thus needs to be protected, for example, with a coating, the debond coating may be located between the carbon fiber and the protective coating such that the protective coating may protect both carbon fiber and debond coating. Both the protective coating and the debond coating can be applied or deposited by chemical vapor deposition (CVD). U.S. Pat. No. 5,015,540 discloses such a multiple fiber coating system. It bears noting that since carbon was earlier identified as a candidate protective coating, under the proper conditions it is possible that a single material, e.g., carbon, can serve the dual role of acting to chemically protect the underlying fiber, as well as acting as the debond material for toughening purposes.

Another technique for enhancing the toughness of silicon-containing composites is to enhance the toughness of the matrix, e.g., by alloying the silicon. Commonly Owned U.S. Pat. No. 6,503,572 discloses that aluminum may be alloyed with the silicon in amounts ranging from about 0.1 percent by weight or less up to about 90 percent. The resulting alloy will still pressurelessly infiltrate into a permeable mass of reinforcement material containing some interconnected carbon to form a reaction bonded silicon carbide composite body. The alloy generally does not need to be heated to a temperature greater than about 100° C. above its liquidus temperature. If the body to be infiltrated contains no elemental carbon, however, the process may have to be carried out at higher temperatures, for example, in the 1600° C. to 1800° C. range. The entire disclosure of this Commonly Owned Patent is hereby incorporated by reference.

Accordingly, in a first preferred embodiment of the first aspect of the instant invention, carbon fibers are coated with a plurality of coatings, at least one of the coatings being a debond coating such as boron nitride, which is then followed by a coating that is protective of the debond coating, such as silicon carbide. These ceramic coatings can substantially rigidize the fibers, so sometimes it is necessary to organize the arrangement or geometry of the fibers into the desired bulk shape, e.g., a preform, prior to the fiber coating process. A reactable source of carbon such as carbon paint is then supplied to the arranged fibers, generally no more than about 10 percent by volume, and preferably no more than about 5 or 6 percent, to complete the preform. The preform optionally may be green machined. Upon pyrolysis of the carbon source, the preform is contacted with a source of molten silicon metal or alloy, which soaks into the porous preform, assisted by chemical reaction of the molten silicon with the supplied reactable carbon. Solidification of the infiltrated silicon or alloy yields a composite body.

In a second preferred embodiment of this first aspect of the invention, the protective layer or coating comprises carbon itself, although typically of a different form than the carbon fibers. The carbon coating is provided sufficiently thickly that it can be thought of as forming part of the matrix phase; thus, these preforms are sometimes referred to as carbon/carbon composites. One means of accomplishing this carbon addition to the carbon fiber preform is to soak the preform in a carbonaceous resin such as furfuryl alcohol, then pyrolyze the resin in a non-oxidizing atmosphere to decompose the resin to essentially elemental carbon. Upon contact with the molten silicon or its alloy, the latter can infiltrate the porous carbon/carbon composite, and the silicon reacts with at least a portion (generally only a portion when done correctly) of the carbon matrix to form at least some SiC in the matrix, along with residual Si or Si alloy. Ideally, the carbon fibers are protected from the molten silicon by the carbon matrix, thereby leaving a composite body comprising carbon fibers and a matrix comprising SiC, Si (alloy) and usually also some residual carbon, mostly at the interface between the carbon fibers and the Si/SiC matrix. The residual carbon coating also provides for toughening of the composite material by making a weak bond with the Si/SiC matrix, thereby permitting movement of the carbon fiber relative to the matrix upon application of mechanical stress.

Without wishing to be bound to any particular theory or explanation, it may be that the free carbon matrix can protect the underlying carbon fibers as a result of the large volume change associated with chemically converting carbon to silicon carbide. Upon chemical reaction with silicon, 1 unit volume of carbon forms 2.3 unit volumes of SiC. The space occupied by the formed SiC can help block off unreacted carbon from further chemical reaction with molten silicon by blocking off the further ingress of this molten silicon. This would explain why carbonaceous resins having a high char yield seem to do a better job of protecting the underlying carbon fibers than do carbonaceous materials having a lower char yield.

Porous preforms of the carbon fibers already embedded in pyrolyzed carbon matrices are commercially available, and are typically supplied as so-called "zero stage" carbon/carbon composites. The carbon/carbon composite typically is supplied as a ply or sheet, with the carbon fibers lying in the plane of the sheet. The fibers may be highly organized, as in a woven structure, or may be unidirectional, or may be randomly arranged as in a mat. The carbon/carbon composite is usually supplied in a porous condition. Alternatively, the carbon/carbon composite can be provided as a precursor body, e.g., with a carbonaceous resin matrix such as epoxy, which then converts to a porous carbon matrix upon pyrolysis. Upon contact with the molten silicon or its alloy, the latter can infiltrate the porous carbon/carbon composite, and the silicon reacts with at least a portion (generally only a portion) of the carbon matrix to form at least some SiC in the matrix, along with residual Si or Si alloy. Ideally, the carbon fibers are protected from the molten silicon by the carbon matrix, thereby leaving a composite body comprising carbon fibers and a matrix comprising SiC, Si (or a metallic component containing Si) and usually also some residual carbon.

Engineering the composite body such that at least some carbon remains unreacted by silicon can be accomplished through attention to, and control of, factors such as the relative amounts (volumetric loading) of reactable carbon and filler, the type or form of the carbon, the relative amount of infiltrant provided, the time required for infiltration and the processing temperature during infiltration. Factors that are conducive to the intentional incomplete reaction of the supplied carbon include supplying relatively large quantities of carbon to the preform, using sources of carbon that have a high char yield such as furfuryl or phenolic resins, and minimizing the processing time and temperature of infiltration.

In a third preferred embodiment of the first aspect of the invention, the carbon fibers may be protected by the pyrolysis product of a silicon-containing polymer such as a polysilazane. Specifically, the carbon fibers or the sheets, plies or 3-D structures into which they may be incorporated can be coated by a polysilazane resin (e.g., by spray coating or infiltrating resin into the fiber bundles, or by dipping the fibers or fiber bundles or sheets into bulk resin). An even simpler technique would be to simply substitute the silicon-containing polymer resin for the phenolic resin, add the carbon fibers, and extrude the mixture. The preform is then assembled and pyrolyzed, leaving the carbon fibers protected by a silicon-containing coating, which coating may include SiC. If green machining is desired, it may be performed at this point. The preform may then be infiltrated with a reactable carbon source such as the carbon paint, and then pyrolyzed, if necessary or desired. The preform is then reactively infiltrated as before with the silicon or silicon alloy to yield a composite body comprising carbon fibers having a SiC coating, and a matrix comprising Si (or a metal containing Si) and at least some in-situ SiC.

As mentioned earlier, there are applications, such as in optics, where materials having a CTE of about 1.0 ppm/K, or even lower, would be desirable. Again, the instant invention appreciates that the lower the modulus of the matrix relative to the fibers, the more that the CTE of the composite is influenced by the CTE of the fibers.

A review of Equation 1 can provide an approach for reducing the influence of matrix materials such as metals whose CTE may overwhelm the CTE of the carbon fibers. Specifically, if the elastic modulus of the matrix can be reduced relative to that of the fibers, then the CTE of the composite will be less influenced by the matrix contribution, and more dominated by the fiber contribution.

One strategy for reducing the elastic modulus of the matrix is to select only relatively low elastic materials as candidate matrix materials, e.g., polymers. This approach, however, excludes many materials that might otherwise possess desirable properties, for example, the higher thermal conductivity generally afforded by silicon.

A better approach might be to work with the desired matrix metal, and find ways to reduce its elastic modulus. One such technique, representing now a second aspect of the invention, is to introduce pores or voids into the material making up the matrix. Preferably, the pores are closed so as not to expose the interior of the composite material to potentially corrosive external environments. Closed pores would also not inhibit evacuation in vacuum environments. The pores should be small and uniformly distributed throughout the matrix.

FIG. 1 is a plot of the mathematical relationship between porosity and the physical property of elastic modulus. Here, the material being presented is magnesium, but the relationship holds for any isotropic material. This graph assumes closed, spherical pores evenly distributed throughout the body. To take one point as an example, one can see that 33 percent porosity reduces the elastic modulus by about 50 percent. For flatter pores, the effect is even greater. Equation 2 illustrates the more comprehensive mathematical relationship among the pore-free elastic modulus $E_o$, pore fraction $f_p$, pore shape coefficient b, and the resulting elastic modulus E.

$$E=E_o\exp(-bf_p) \quad \text{Equation 2:}$$

There are a number of ways to intentionally introduce pores into the matrix material. For example, the composite may be processed using powder metallurgical techniques. More specifically, the matrix may be added to the fibers or placed between fiber plies in finely divided form (e.g., as a powder), and the admixture incompletely sintered to produce a porous, reticulated matrix. Additionally, one or more fugitive materials may be added to the finely divided matrix metal prior to sintering such that during subsequent heating and partial sintering, the fugitive material burns out or volatilizes, and each body of fugitive material leaves behind a pore.

For metal matrix composite materials made by infiltrating molten metal into a porous, metal permeable body of reinforcement material, the propensity for dissolved gasses to come out of solution and create bubbles upon solidification of the metal may be employed to advantage. One such gas that exhibits this characteristic, particularly with aluminum melts, is hydrogen. In fact, hydrogen is normally thought of as a nuisance substance in aluminum casting procedures, and foundry workers usually take precautions (e.g., vacuum degassing) to avoid hydrogen entrapment in their melts to be cast. In certain applications, a little hydrogen may be beneficial, for example, by reducing somewhat the amount of solidification shrinkage of an aluminum casting. The hydrogen contamination typically arises from exposure to water vapor, and merely exposing a melt of aluminum to an ambient, moist air atmosphere for any appreciable amount of time will result in the uptake of hydrogen by the melt. Where hydrogen gas is to be added deliberately to an aluminum melt, the traditional approach was to add a slice of apple or potato to the molten metal. Those familiar with modern aluminum foundry techniques are aware of commercially available metal treatment products for this purpose.

Still further, pores may be incorporated into the matrix by infiltrating the molten matrix metal into a porous mass or preform containing in addition to the carbon fibers some hollow bodies of filler material such as alumina "microspheres." In one embodiment, the carbon fibers, or the plies or sheets into which they are incorporated, are arranged quasi-isotropically, and this assemblage is then constrained or clamped around the periphery thereof, as for example, by a refractory frame structure. This assembly is then immersed into a slurry containing the microspheres, thereby depositing microspheres among the carbon fibers. After thoroughly drying the liquid vehicle of the slurry, molten matrix metal is then caused to infiltrate the permeable mass, thereby embedding both the carbon fibers and the alumina microspheres.

The following examples illustrate with still more specificity several preferred embodiments of the present invention. These examples are meant to be illustrative in nature and should not be construed as limiting the scope of the invention.

EXAMPLE I

Sample A

This Example illustrates the fabrication of a carbon fiber reinforced silicon composite using a reactive infiltration technique.

A number of plies consisting of woven carbon fiber cloth (Grade T300 carbon fiber, approx 1000 fibers/tow, plain weave, BP Amoco, Greenville, S.C.) are stacked to a desired extent and affixed to one another using a low-residue binder. The assembly of bound carbon cloth plies is then coated with boron nitride, followed by silicon carbide (Honeywell Advanced Composites, Inc., Newark, Del.) under conditions designed to achieve uniform coating thickness in various regions of the laminate. Each of the BN and SiC coatings were deposited to a thickness of about 0.5 to 1.0 micron.

A piece of coated laminate measuring about 2 inches (51 mm) square by about 0.125 inch (3 mm) thick was immersed into a pool of carbon paint (Graphokote 120, Dixon, Inc.). A rough vacuum was applied, and after about 5 minutes, the piece was removed from the pool of paint, excess paint was removed from the surface, the piece was then placed onto a Teflon sheet, and allowed to dry in vacuum for about 5 minutes.

To effect infiltration, the coated laminate was placed into a BN coated crucible contained within a graphite chamber. About 4–5 grams of commercially pure (0.5 wt % Fe max) silicon metal in lump form (Elkem Metals, Pittsburgh, Pa.) was spread over the surface of the square plate. The furnace was evacuated, and then the temperature within the chamber was raised from about ambient to a temperature of about 1350 C at a rate of about 100 C per hour. After maintaining a temperature of about 1350 C for about 1 hour, the temperature was raised to a temperature of about 1425 C at a rate of about 50 C per hour. After maintaining a temperature of about 1425 C for about 15 minutes, the temperature was reduced at a rate of about 200 C per hour until the furnace could safely be let back up to atmospheric pressure and the infiltrated laminate recovered from the graphite chamber.

Figure 2A:
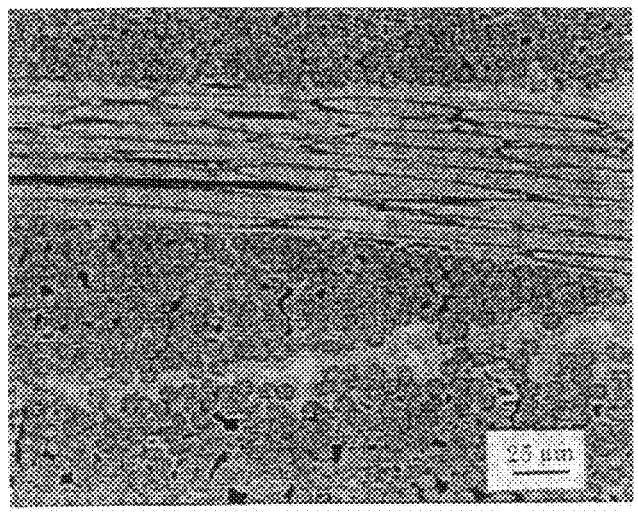
FIG. 2A is an optical photomicrograph of a polished cross-section of the resulting composite body of Example IV.
Figure 2B:
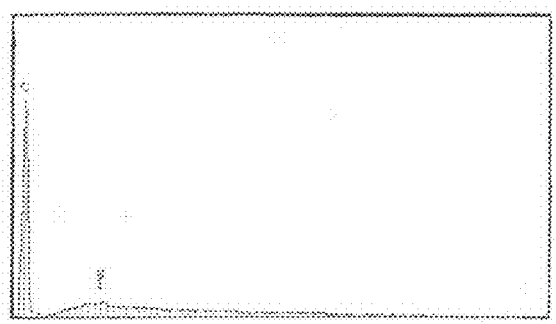
FIG. 2B is an EDAX pattern from the fiber area of the composite body of Example IV.
Figure 2C:
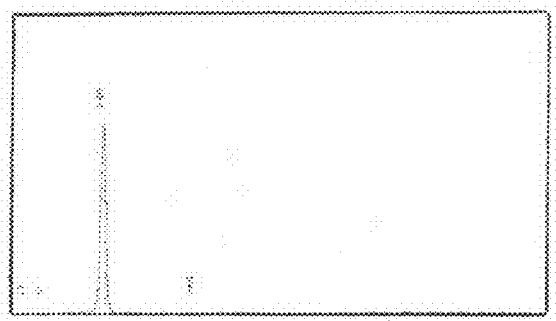
FIG. 2C is an EDAX pattern from the matrix area of the composite body of Example IV.

FIG. 2A is an optical photomicrograph of a polished cross-section of the resulting composite body, specifically in a region where two fiber plies cross one another. The SiC coating on the carbon fibers is clearly seen, as is the silicon matrix. A slight amount of SiC is also formed in-situ from reaction of the molten silicon infiltrant with the carbon paint. Among the significant features of the photo is that the carbon fibers were well protected from potential chemical reaction with the molten silicon during infiltration. This is supported by the EDAX (energy dispersive analysis by x-ray) patterns for the fiber and matrix shown in FIGS. 2B and 2C, respectively. Specifically, the EDAX pattern for the carbon fiber shows a large carbon peak, and a very small silicon peak. If the fibers had reacted with the silicon infiltrant, the EDAX pattern would have shown a much larger Si peak. Similarly, the EDAX pattern for the matrix shown in FIG. 2C indicates that the matrix is either silicon or silicon carbide, but not free carbon This result is confirmed by optical microscopy observations showing different gray levels for C, SiC and Si phases. An approximately 1 micron thick layer of SiC is observed surrounding the C fibers, divided roughly equally between that deposited by CVI and that deposited in-situ during reactive infiltration of the molten silicon. The formed composite body consisted of about 35 vol % C fibers, about 10–20 vol % SiC, and about 45–55 vol % Si-containing matrix phase.

Sample B

The technique of Sample A was substantially repeated, except that the carbon fiber was Grade EWC-600 from BP Amoco Polymers, Alpharetta, Ga. The formed composite body consisted of about 25–30 vol % C fibers, about 40–45 vol % SiC, and about 25–35 vol % Si-containing matrix phase.

EXAMPLE II

This Example demonstrates another approach to the fabrication of a carbon fiber reinforced silicon composite body.

A carbon/carbon composite (CCAT, Ft. Worth, Tex.) consisting of a plurality of layers of Grade T-300 (BP Amoco) or Grade EWC-600 (BP Amoco Polymers, Alpharetta, Ga.) carbon fiber cloths in a phenolic resin (Grade SC-1008, Borden Chemical, Louisville, Ky.) was pyrolyzed in a non-oxidizing atmosphere at a temperature of about 900 C to produce a zero-stage composite body. The zero-stage body typically contains about 35–50 volume percent fibers, about 20–30 percent carbon matrix and about 20–30 percent porosity, and is typically about 0.155 inch (3.9 mm) thick.

Figure 3A:
FIG. 3A is an optical photomicrograph of the formed composite body of Example V.
Figure 3B:
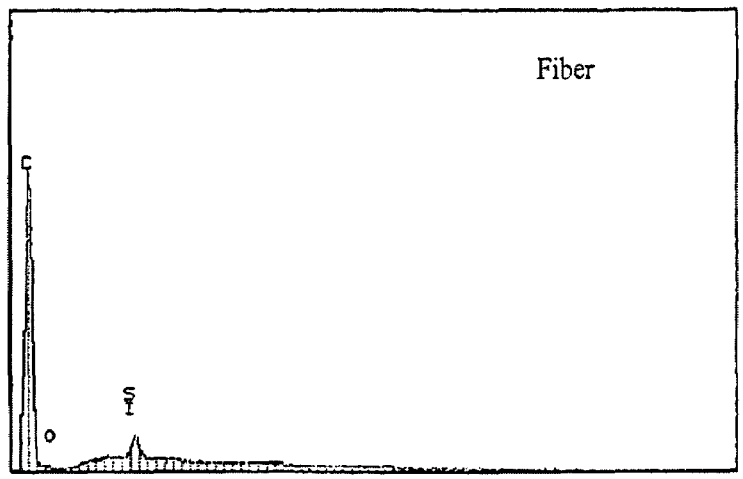
FIG. 3B is an EDAX pattern from the fiber area of the composite body of Example V.
Figure 3C:
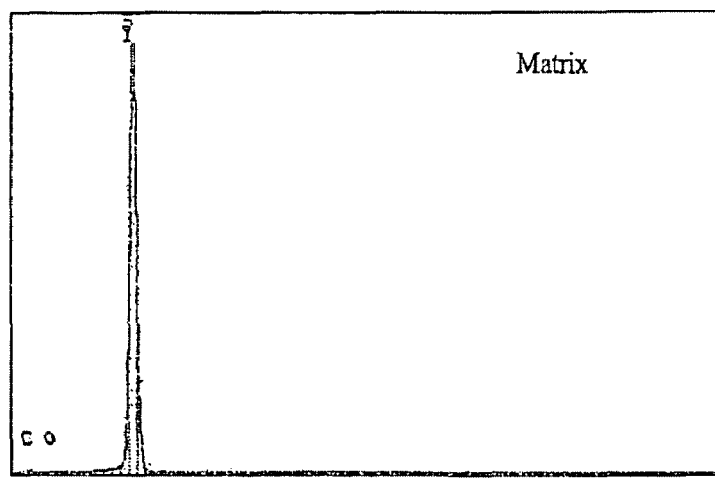
FIG. 3C is an EDAX pattern from the matrix area of the composite body of Example V.

A two inch (51 mm) square piece of the zero-stage composite material was placed flat (horizontally) in a BN coated graphite crucible contained within a graphite chamber. About 15 grams of silicon metal in lump form (Elkem Metals, Inc.) was placed on top of the square surface of the zero-stage body. The composite material was then thermally processed in substantially the same manner as the material in Example I. As a result of this processing, the silicon melted and reactively infiltrated the carbon—carbon composite body to produce a more complex composite body having a matrix comprising silicon and silicon carbide. A sample of the complex composite material was metallographically prepared and examined in the optical microscope and in the SEM and analyzed chemically using energy dispersive x-ray analysis (EDAX). The microstructure specifically consists of carbon fibers dispersed in a matrix consisting of some SiC formed in-situ (e.g., from reaction of molten silicon with carbon from the phenolic resin), residual, unreacted silicon, and some residual, unreacted carbon. FIG. 3A, in particular, is an optical photomicrograph featuring the T-300 carbon fibers. Among the significant features of the photo is the absence of reaction of the carbon fibers with the molten silicon during processing. In other words, the carbon from the phenolic resin protected the carbon fibers during infiltration. The EDAX patterns of FIGS. 3B and 3C again are of the fiber and matrix portions of the composite, respectively. Just as in Example I, the patterns show essentially no infiltration into or reaction of Si into the fiber. Accordingly, the gray phase that is seen in the photomicrograph is confirmed to be carbon, which conclusion is supported by the fact that this phase has the same gray level as the fibers, which are known to be carbon.

The composite body featuring the T-300 carbon fibers contained about 50–55 vol % C fibers, about 30–40% SiC and about 10–15% residual Si-bearing phase. The composite body featuring the EWC-600 carbon fibers, however, exhibited some chemical reaction of the fibers by the silicon infiltrant. Thus, its final composition was about 30–40 vol % C fibers, 50–60% SiC and about 10–20% residual Si-containing phase.

EXAMPLE III

This Example demonstrates the fabrication of a carbon-fiber silicon composite body wherein the fibers are arranged as to exhibit quasi-isotropic properties.

A prepreg consisting of aligned Mitsubishi K13710 carbon fibers embedded in a RS-11 epoxy matrix was obtained from YLA, Inc. (Benicia, Calif.).

Pieces measuring about 2 inches (51 mm) square were cut from the prepreg at 0, 45 and 90 degree angles with respect to the fiber direction. The pieces were then stacked atop one another in the following order to make a quasi-isotropic laminate: 0, 90, +45, −45, +45, 90, 0 degrees orientation. While stacking the pieces, about 0.25 gram of Mitsubishi pitch (Grade AR) in powder form was spread onto each piece. The laminate was then heated in an air atmosphere oven under a slight uniaxial pressure (provided by a graphite cube measuring about 2 inches (51 mm) on a side) to melt the pitch. The heating was at 50 C per hour to a temperature of about 250 C, holding at about 250 C for about one hour, further heating to a temperature of about 340 C at a rate of about 50 C per hour, holding at about 340 C for about one hour, and then cooling at a rate of about 50 C per hour.

The laminate was then pyrolyzed in vacuum, specifically by heating to a temperature of about 900 C at a rate of about 100 C per hour, maintaining a temperature of about 900 C for about one hour, and then cooling at a rate of about 200 C per hour. The pyrolyzed laminate measured about 2 inches (51 mm) square by about 0.04 inch (1.0 mm) thick.

To carry out the reactive infiltration, about 2.4 grams of silicon metal in lump form (Elkem Metals, Inc.) was placed on top of the pyrolyzed laminate, which was then placed into a boron nitride coated graphite mold, which in turn was placed into a graphite chamber sufficiently non-hermetic so as to provide for atmosphere exchange. The graphite chamber and its contents were then placed into a vacuum furnace, which was then sealed, evacuated, and then energized. The contents of the graphite chamber were then heated to a temperature of about 1350 C at a rate of about 100 C per hour, maintained at a temperature of about 1350 C for about one hour, further heated to a temperature of about 1425 C at a rate of about 50 C per hour, maintained at a temperature of about 1425 C for about 15 minutes, and then cooled at a rate of about 200 C per hour.

Upon recovery from the furnace, the infiltrated laminate was found to contain about 50–55 vol % C fibers, about 8–10% SiC, and about 35–40% residual Si phase.

Characterization of Mechanical and Physical Properties

After the fabrication step, various mechanical and physical properties of the instant reaction-bonded ceramic composite materials were measured. Density was determined by the water immersion technique in accordance with ASTM Standard B 311. Flexural strength in four-point bending was determined based on ASTM Procedure No. D790 using a screw-driven Sintech model CITS-2000 universal testing machine under displacement control at a crosshead speed of about 0.51 mm/min. Specimens measuring about 50 mm in length by about 9.8 mm wide by about 2 to 4 mm in thickness were tested with the loading direction parallel to the 9.8 mm dimension and with inner and outer loading spans of 20 and 40 mm, respectively.

Measurement of CTE

Because the composite materials of the instant invention possess very low CTE's, conventional thermal mechanical analysis (TMA) using a dilatometer is not sufficiently sensitive. Instead, a laser interferometry technique was used, whereby parallel, opposing mirrors are mounted at opposite ends of the test specimen, and a laser beam is split in two, with each beam reflecting off one mirror and then combined to create an interference pattern. As the sample is heated, the changing pattern corresponds to the change in sample length, measured in wavelengths of the laser light.

Results of density, flexural strength and CTE of the instant low expansion carbon fiber composites are provided in Table I. When appropriate, the results are provided as a mean+/− one standard deviation.

TABLE I

Summary of properties of various carbon fiber composites.

| Example | Fiber | Lay up | Matrix | Density (g/cc) | Flexural Strength (MPa) | CTE (−50 to 100° C.) ppm/K |
|---|---|---|---|---|---|---|
| II | T300 | 8HS | C, SiC, Si | 2.394 | 64.5 | 0.96 +/− 0.01 |
| I | T300 | PW | BN, SiC, Si | 1.995 | 156 | 0.77 +/− 0.01 |
| III | K13710 | [0/90/+45/−45]s | SiC/Si | 2.278 | 115 | 1.06 |
| II | EWC-600 | 8HS | C, SiC, Si | 2.568 | 184 | 1.75 +/− 0.01 |
| I | EWC-600 | 8HS | BN, SiC, Si | 2.49 | 162.1 | −0.46 +/− 0.01 |

8HS: 8 harness satin weave; PW: plain Weave

EXAMPLE IV

This Example demonstrates the fabrication of a hexagonal mirror approximately 8 inches (about 200 mm) across from edge to edge. As an overview, a porous zero stage carbon/carbon preform was fabricated, then cut and green machined to produce several small shapes of preform components, then the preform subunits were assembled and adhesively bonded to one another to produce the desired gross shape of the mirror substrate, then infiltrated with molten silicon-based infiltrant, then ground and lapped to final rough dimensions, and finally coated with silicon metal on the reflecting surface of the substrate, and polished to the final mirror profile and accuracy.

Figure 4:
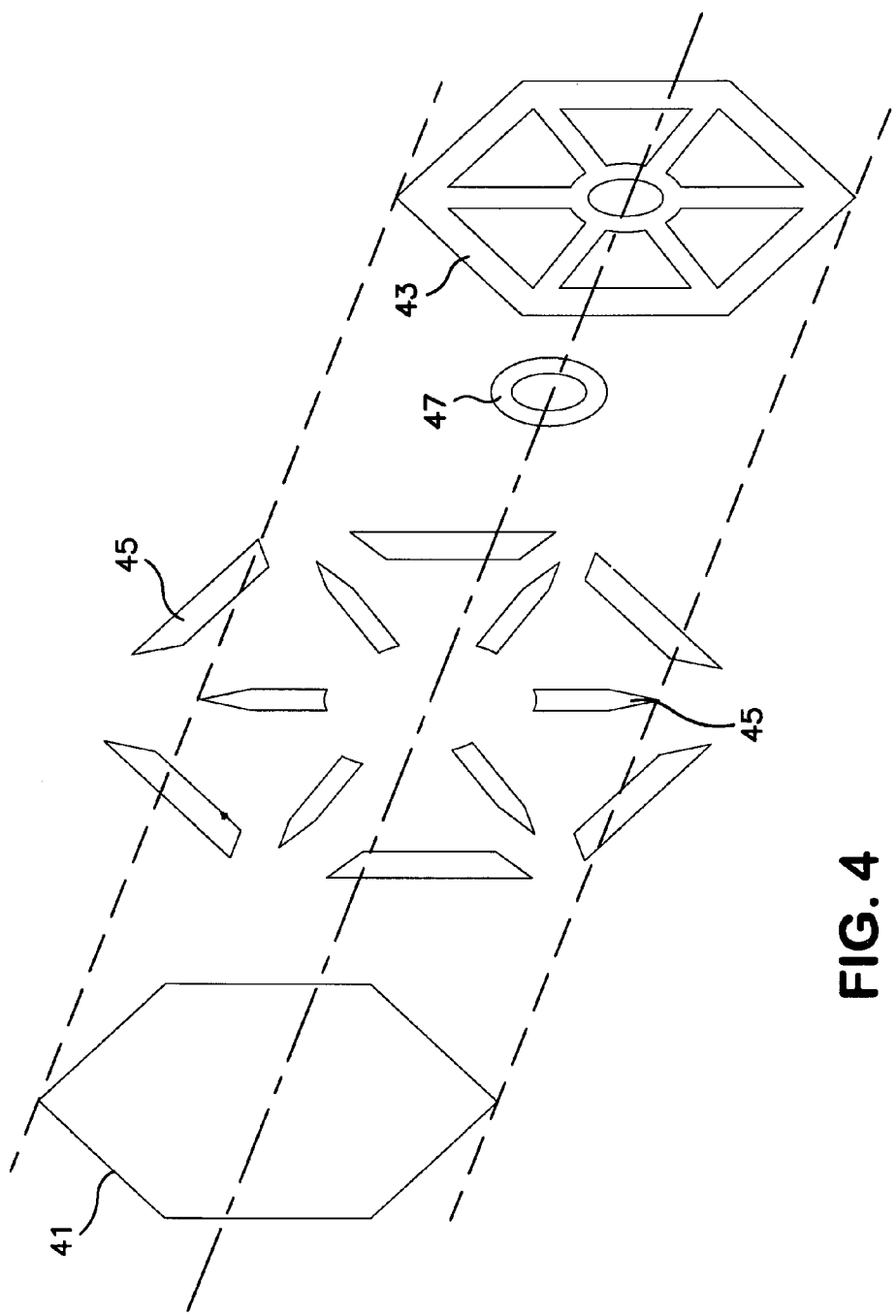
FIG. 4 is an exploded isometric view of the component preforms that were assembled and bonded together to make the complex-shaped hexagonal mirror of Example VII.
Figure 5:
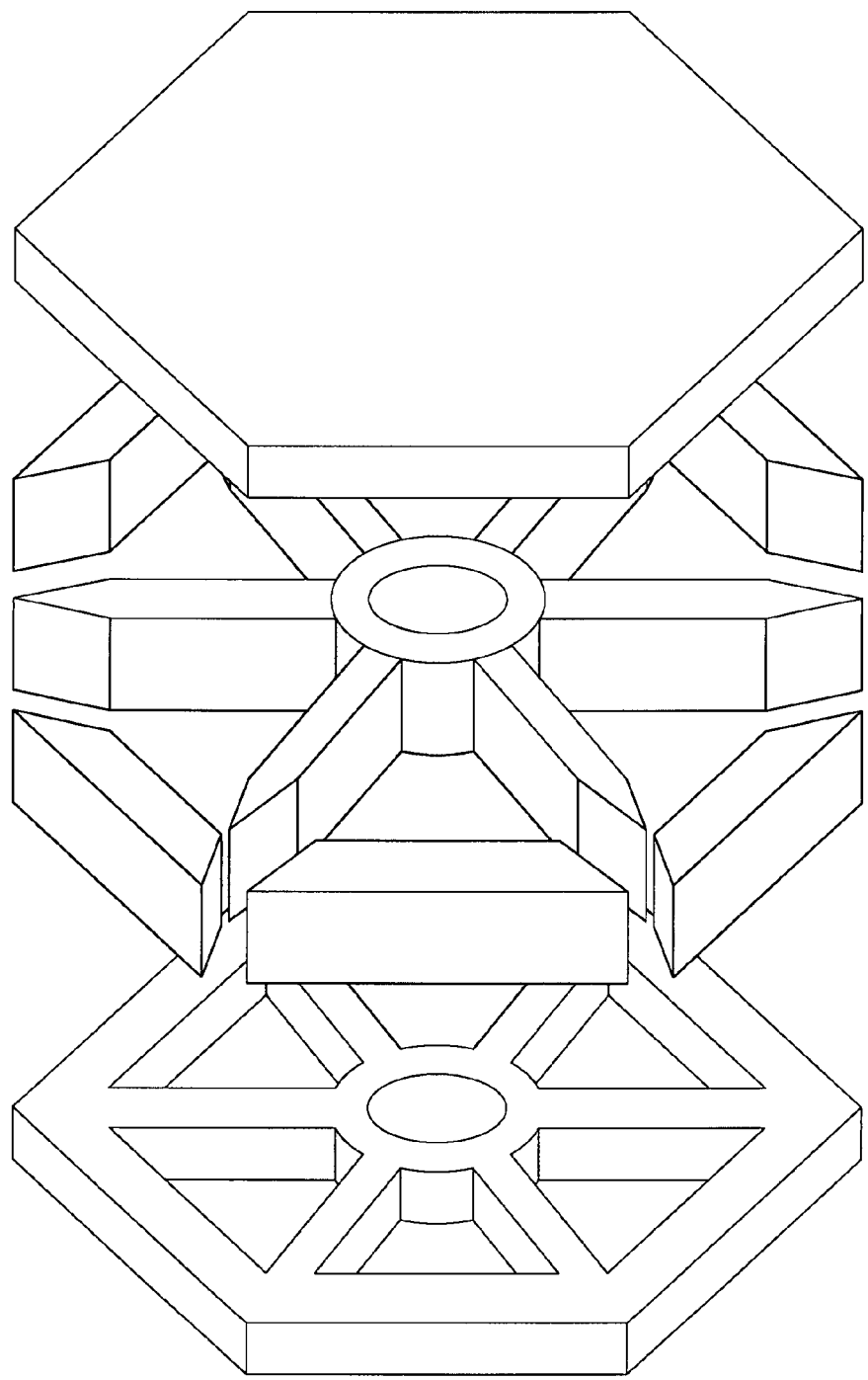
FIG. 5 is another isometric drawing of the hexagonal mirror preform that better shows the thickness dimension of the component subunits.

A mirror preform was prepared in substantially the same manner as for Example II above. In particular, a carbon/phenolic composite body (CCAT, Ft. Worth, Tex.) was pyrolyzed to produce a zero-stage ply measuring about 11 inches by about 10 inches. The mirror substrate was assembled from the different component shapes as shown in FIG. 4 that were green machined from stock of the zero-stage carbon/carbon material: the front face 41, the back face 43 and the reinforcing ribs 45. A plurality of plies were then laminated until the desired thickness of each shape was achieved. FIG. 5 is another drawing that better illustrates the thickness that was developed by the laminating process. Then, the component shapes were assembled and bonded to one another to form a complex-shaped hexagonal mirror preform. The adhesive (binder) for the laminating and assembling of the component shapes consisted of about 39 percent by weight of Grade K223-HT carbon fibers (Mitsubishi Chemical, distributed by YLA, Inc., Benecia, Calif.) measuring about 200 microns long dispersed in an epoxy (ResinFusion 0613, Ciba Performance Polymers, Lansing, Mich.). In addition, this binder containing carbon fibers was also used to make the tubular hub portion 47 of the preform, specifically by casting this binder material into a mold having this internal shape. Following curing of the adhesive, the assembled mirror substrate was re-pyrolyzed, and then infiltrated with the molten silicon metal, which was provided in about the same weight ratio as in Example II. The as-infiltrated mirror substrate was then ground to more exacting dimensions. Then, the front face (to be the reflecting surface) was lapped to a flatness of less than 1 micron.

Holes were then drilled on the side ribs via electric discharge machining to permit fixturing for the subsequent application of the reflecting material. Following a vacuum baking operation to remove volatilizable contaminants, the mirror substrate was coated on its front surface with amorphous silicon to a depth of about 100 microns using plasma-enhanced chemical vapor deposition (PECVD), provided by Surmet (Burlington, Mass.).

Figure 6:
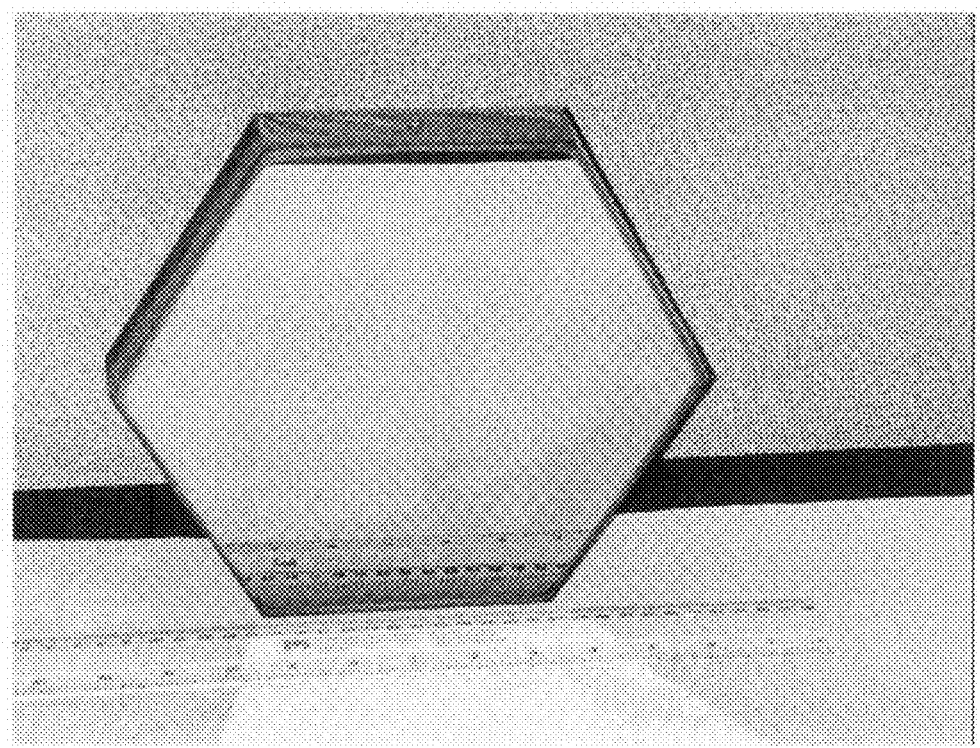
FIG. 6 is a photograph of the completed mirror in the as-polished condition.

The hexagonal mirror was them polished to yield a 7.5 inch (190 mm) edge-to-edge clear aperture having a surface roughness of about 30 Angstroms Ra and within about 1.27 wavelength (632 nm) of perfect flatness, as measured from peak-to-valley using a laser interferometer (or about 0.17 wave using the root-mean-square value). It was felt that even more precise polishing could be achieved if the budget for this project permitted. In other words, it was felt that these specifications were not limited by technical issues, e.g., the materials or methods used. A photograph of the completed mirror is shown in FIG. 6.

INDUSTRIAL APPLICABILITY

The low CTE mirrors of the instant invention will find utility in space applications, e.g., space-based mirrors. These mirrors should also be useful in certain earth-based applications such as for interferometer components for the stages used in semiconductor fabrication equipment, for example. Other possible application areas include robotics and metrology. Still other applications that can take advantage of the low CTE and low density of the instant mirrors will also occur to one skilled in such arts.

An artisan of ordinary skill will appreciate that various modifications may be made to the invention herein described without departing from the scope or spirit of the invention as defined in the appended claims.

What is claimed is:

1. A mirror comprising a reflective surface bonded to a substrate, the reflective surface comprising silicon metal, the substrate comprising a composite body comprising (i) a matrix component comprising silicon metal, (ii) a reinforcement material comprising a plurality of carbon fibers distributed throughout said matrix component, and (iii) at least one coating disposed between said carbon fibers and said matrix, and further wherein said substrate has a CTE between about negative 0.46 and positive 1.75 ppm/K.

2. The mirror of claim 1, wherein said substrate has a coefficient of thermal expansion between −0.46 ppm/K and +1.06 ppm/K.

3. The mirror of claim 1, wherein said silicon metal of said reflective surface is substantially amorphous.

4. The mirror of claim 1, wherein said reflective surface consists essentially of said silicon metal.

5. The mirror of claim 1, wherein said coating comprises elemental carbon other than graphite.

6. The mirror of claim 1, wherein said composite body comprises reaction bonded silicon carbide.

7. The mirror of claim 1, wherein said carbon fibers are woven.

8. The mirror of claim 1, wherein said carbon fibers have an overall or average CTE in an axial direction that is a negative value.

* * * * *